(12) United States Patent
Wang

(10) Patent No.: US 10,348,254 B2
(45) Date of Patent: Jul. 9, 2019

(54) POWER AMPLIFIER AND PROTECTION CIRCUIT FOR USE IN RF ACTIVE CIRCUIT

(71) Applicant: RichWave Technology Corp., Taipei (TW)

(72) Inventor: Yi-Fong Wang, Taipei (TW)

(73) Assignee: RichWave Technology Corp., Taipei (TW)

( * ) Notice: Subject to any disclaimer, the term of this patent is extended or adjusted under 35 U.S.C. 154(b) by 18 days.

(21) Appl. No.: 15/892,361

(22) Filed: Feb. 8, 2018

(65) Prior Publication Data

US 2019/0068137 A1 Feb. 28, 2019

(30) Foreign Application Priority Data

Aug. 22, 2017 (TW) .............................. 106128409 A

(51) Int. Cl.

| H03F 1/52 | (2006.01) |
|---|---|
| H03F 3/19 | (2006.01) |
| H03F 3/24 | (2006.01) |
| H03F 3/195 | (2006.01) |
| H03F 3/21 | (2006.01) |
| H03F 3/213 | (2006.01) |

(52) U.S. Cl.

CPC .............. *H03F 1/523* (2013.01); *H03F 1/52* (2013.01); *H03F 3/19* (2013.01); *H03F 3/195* (2013.01); *H03F 3/211* (2013.01); *H03F 3/213* (2013.01); *H03F 3/245* (2013.01); *H03F 2200/105* (2013.01); *H03F 2200/21* (2013.01); *H03F 2200/408* (2013.01); *H03F 2200/451* (2013.01); *H03F 2200/462* (2013.01); *H03F 2200/78* (2013.01)

(58) Field of Classification Search

CPC ....................................................... H03F 1/523
See application file for complete search history.

(56) References Cited

U.S. PATENT DOCUMENTS

| 6,407,689 | B1 * | 6/2002 | Bazarjani | ................ | H03M 3/32 |
|---|---|---|---|---|---|
| | | | | | 341/132 |
| 2001/0041584 | A1 * | 11/2001 | Watanabe | .............. | H04B 1/406 |
| | | | | | 455/553.1 |
| 2003/0155978 | A1 * | 8/2003 | Pehlke | .................... | H03F 1/025 |
| | | | | | 330/296 |

(Continued)

FOREIGN PATENT DOCUMENTS

TW 201448454 A 12/2014

*Primary Examiner* — Patricia T Nguyen
(74) *Attorney, Agent, or Firm* — Winston Hsu

(57) ABSTRACT

A protection circuit for use in an RF active circuit includes a signal strength detecting circuit, a current detecting circuit, a logic circuit, and a switching unit. The signal strength detecting circuit is coupled to the signal input end or the signal output end of the RF active circuit and configured to generate a first detecting signal according to the signal strength of the RF signal. The current detecting circuit is configured to detect the VSWR of the RF signal based on the driving current of the RF active circuit, thereby generating a corresponding second detecting signal. The logic circuit is configured to generate a switch control signal according to the first detecting signal and the second detecting signal. The switching unit is configured to lower the driving current of the RF active circuit according to the switch control signal.

20 Claims, 5 Drawing Sheets

(56) References Cited

U.S. PATENT DOCUMENTS

| | | |
|---|---|---|
| 2005/0242882 A1 | 11/2005 | Anderson |
| 2007/0182490 A1 | 8/2007 | Hau |
| 2008/0231368 A1* | 9/2008 | Suzaki ............... H03F 1/30 330/277 |
| 2009/0207764 A1* | 8/2009 | Fukamachi ............ H04B 1/44 370/297 |
| 2011/0043956 A1 | 2/2011 | Su |
| 2011/0140772 A1* | 6/2011 | Sengupta ............ H03F 1/0266 330/2 |
| 2011/0292554 A1 | 12/2011 | Yao |
| 2014/0266452 A1 | 9/2014 | Scott |
| 2015/0130537 A1 | 5/2015 | Nakamura |
| 2016/0099688 A1 | 4/2016 | Quaglietta |

* cited by examiner

POWER AMPLIFIER AND PROTECTION CIRCUIT FOR USE IN RF ACTIVE CIRCUIT

CROSS REFERENCE TO RELATED APPLICATION

This application claims priority of Taiwan application No. 106128409 filed on Aug. 22, 2017, the disclosure of which is hereby incorporated by reference herein in its entirety.

TECHNICAL FIELD

The present invention is related to a power amplifier and a protection circuit for use in an RF active circuit, and more particularly, to a power amplifier and a protection circuit capable of reducing the negative impact caused by surge or voltage standing wave ratio for use in an RF active circuit.

BACKGROUND

Amplifiers are commonly used in an electronic device for enhancing the characteristics of the electronic device, such as gain, bandwidth and linearity. The vast application range of amplifiers includes active filters, buffers, analog-to-digital converters (ADCs), and radio frequency (RF) transceivers. In wireless communication systems, a power amplifier is an essential component in RF circuits. Power amplifiers are normally arranged on the front-end of an antenna transmitter for enlarging the amplitude of output signals.

RF surge refers to a rapid change in the peak of RF signals which occurs within a very short period of time in a circuit. When an electronic device (such as a power amplifier) is plugged in into a power outlet or when there is an impedance mismatch present in the system, a sudden increase or decrease may occurs in the operational or bias voltage/current of the electronic device. Although the duration of an RF surge signal is normally very short, it brings negative impacts, such as excessive voltage/current, which may permanently damage the internal devices of sensitive electronic devices.

Also, voltage standing wave ratio (VSWR) is a parameter for evaluating the performance of power amplifiers. VSWR is defined as the ratio between reflected power and input power. When the impedance of a device is larger or smaller than another connected device in the RF system, power is reflected at the place of mismatch, which creates standing waves along the transmission line and causes power return loss. If the VSWR is equal to the ideal value of 1.0, there would be no reflected power and the voltage would have a constant magnitude along the transmission line. A larger VSWR results in a larger reflected power and causes larger return loss. In real application, an imperfect VSWR not only weakens signal strength, the reflected power may also damage the internal devices of the electronic device.

Therefore, there is a need for a power amplifier capable of reducing the negative impact caused by surge or VSWR for use in an RF active circuit.

SUMMARY

An embodiment of the present invention provides a power amplifier which includes an input end for inputting an RF signal, an output end for outputting the RF signal after being amplified, a first amplifying circuit, a second amplifying circuit, a first supply input end for inputting first supply current, a second supply input end for inputting second supply current, a first bias circuit for outputting first bias current at a bias output end, a second bias circuit for outputting second bias current at a bias output end, and a protection circuit. The first amplifying circuit is configured to amplify the RF signal and includes an RF input end coupled to the input end of the power amplifier for inputting the RF signal, and an RF output end coupled to the output end of the power amplifier for outputting the RF signal after being amplified. The second amplifying circuit is configured to amplify the RF signal and coupled between the input end of the power amplifier and the RF input end of the first amplifying circuit, wherein the first amplifying circuit is driven by the first bias current and the first supply current, and the second amplifying circuit is driven by the second bias current and the second supply current. The protection circuit is coupled to the RF input end of the first amplifying circuit and includes a signal strength detecting circuit, a current detecting circuit, a logic circuit, a first switch, and a second switch. The signal strength detecting circuit is configured to detect an RF surge of the RF signal, thereby generating a corresponding first detecting signal. The current detecting circuit is coupled to the first amplifying circuit and configured to generate a second detecting signal according to the first bias current. The logic circuit is configured to generate a first switch control signal and a second switch control signal according to the first detecting signal and the second detecting signal. The first switch is configured to lower the first bias current or the first supply current according to the first switch control signal. The second switch is configured to lower the second bias current or the second supply current according to the second switch control signal.

Another embodiment of the present invention also provides a power amplifier which includes an input end for inputting an RF signal, an output end for outputting the RF signal after being amplified, an amplifying circuit, and a protection circuit. The amplifying circuit is configured to amplify the RF signal and includes an RF input end coupled to the input end of the power amplifier for inputting the RF signal, an RF output end coupled to the output end of the power amplifier for outputting the RF signal after being amplified, a first supply input end for inputting first supply current, a first bias circuit for outputting first bias current at a bias output end, and a first protection circuit. The power amplifier is driven by the first bias current and the first supply current. The first protection circuit is coupled to the RF input end of the first amplifying circuit or the RF output end of the first amplifying circuit, and includes a first signal strength detecting circuit configured to detect an RF surge of the RF signal, thereby generating a corresponding first detecting signal; a first logic circuit configured to generate a first switch control signal according to the first detecting signal; and a first switching unit configured to lower the first bias current or the first supply current according to the first switch control signal.

An alternative embodiment of the present invention also provides a protection circuit for use in an active RF circuit which is driven by driving current. The protection circuit includes a signal strength detecting circuit, a current detecting circuit, a logic circuit and a switching unit. The signal strength detecting circuit is coupled to an RF input end or an RF output end of the active RF circuit and configured to generate a first detecting signal according to a signal strength of the RF signal. The current detecting circuit is coupled to the active RF circuit and configured to detect a voltage standing wave ratio of the RF signal based on the driving current, thereby generating a corresponding second detecting signal. The logic circuit is configured to generate a first switch control signal according to the first detecting signal and the second detecting signal. The switching unit is configured to lower the driving current according to the first switch control signal.

DETAILED DESCRIPTION

Figure 1:
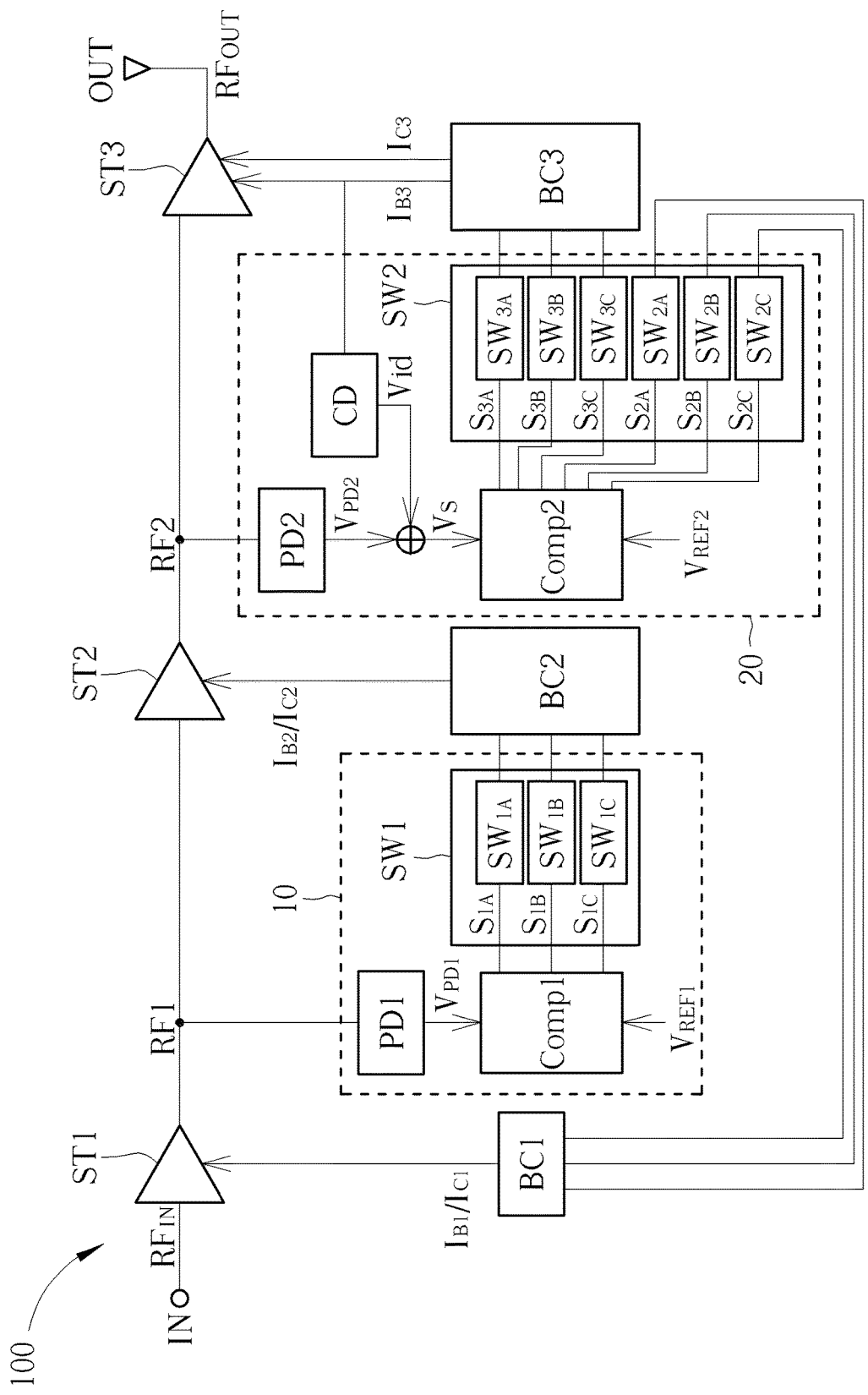
FIG. 1 is a functional block diagram illustrating a power amplifier according to an embodiment of the present invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

FIG. 1 is a functional block diagram illustrating a power amplifier 100 according to an embodiment of the present invention. The power amplifier 100 includes an input end IN, an output end OUT, first-stage to third-stage amplifying circuits ST1~ST3, first-stage to third-stage bias circuits BC1~BC3, a first protection circuit 10, and a second protection circuit 20. The input end IN of the power amplifier 100 is used to input an RF signal $RF_{IN}$, and the output end OUT of the power amplifier 100 is used to output an RF signal $RF_{OUT}$ which is the RF signal $RF_{IN}$ after being amplified. The first-stage amplifying circuit ST1 is configured to receive the RF signal $RF_{IN}$ at an RF input end, generate an RF signal RF1 by amplifying the RF signal $RF_{IN}$, and output the RF signal RF1 at an RF output end. The second-stage amplifying circuit ST2 is configured to receive the RF signal RF1 at an RF input end, generate an RF signal RF2 by amplify the RF signal RF1, and output the RF signal RF2 at an RF output end. The third-stage amplifying circuit ST3 is configured to receive the RF signal RF2 at an RF input end coupled to the RF output end of the second-stage amplifying circuit ST2, generate the RF signal $RF_{OUT}$ by amplify the RF signal RF2, and output the RF signal $RF_{OUT}$ at an RF output end coupled to the output end OUT.

In the power amplifier 100 of the present invention, the first-stage bias circuit BC1 is configured to provide bias current $I_{B1}$ and supply current $I_{C1}$ for driving the first-stage amplifying circuit ST1, the second-stage bias circuit BC2 is configured to provide bias current $I_{B2}$ and supply current $I_{C2}$ for driving the second-stage amplifying circuit ST2, and the third-stage bias circuit BC3 is configured to provide bias current $I_{B3}$ and supply current $I_{C3}$ for driving the third-stage amplifying circuit ST3.

The first protection circuit 10 is coupled between the RF output end of the first-stage amplifying circuit ST1 and the RF input end of the second-stage amplifying circuit ST2, or coupled to an intermediate stage of the power amplifier 100. The first protection circuit 10 includes a first signal strength detecting circuit PD1, a first logic circuit Comp1, and a first switching unit SW1. The first signal strength detecting circuit PD1 is configured to detect the RF surge of the RF signal RF1, thereby generating a corresponding detecting signal $V_{PD1}$. For example, the first signal strength detecting circuit PD1 may detect the RF surge of the RF signal RF1 by detecting the peak or the power of the RF signal RF1. The first logic circuit Comp1 is configured to generate switch control signals $S_{1A}$~$S_{1C}$ according to the relationship between the detecting signal $V_{PD1}$ and a first reference voltage $V_{REF1}$. The first switching unit SW1 includes switches $SW_{1A}$, $SW_{1B}$, and $SW_{1C}$ and configured to control the output of the second-stage bias circuit BC2 according to the switch control signals $S_{1A}$~$S_{1C}$.

The second protection circuit 20 is coupled between the RF output end of the second-stage amplifying circuit ST2 and the RF input end of the third-stage amplifying circuit ST3, or coupled to an intermediate stage of the power amplifier 100. The second protection circuit 20 includes a second signal strength detecting circuit PD2, a current detecting circuit CD, a second logic circuit Comp2, and a second switching unit SW2. The second signal strength detecting circuit PD2 is configured to detect the RF surge of the RF signal RF2, thereby generating a corresponding detecting signal $V_{PD2}$. For example, the second signal strength detecting circuit PD2 may detect the RF surge of the RF signal RF2 by detecting the peak or the power of the RF signal RF2. The current detecting circuit CD is coupled to the third-stage amplifying circuit ST3 and configured to generate a detecting signal Vid according to the bias current $I_{B3}$ of the third-stage amplifying circuit ST3. The second logic circuit Comp2 is configured to generate switch control signals $S_{2A}$~$S_{2C}$ and $S_{3A}$~$S_{3C}$ according to the relationship between the detecting signal $V_S$ and a second reference voltage $V_{REF2}$, wherein the detecting signal $V_S$ is associated with the detecting signals $V_{PD2}$ and Vid. The second switching unit SW2 includes switches $SW_{2A}$~$SW_{2C}$ and $SW_{3A}$~$SW_{3C}$ and configured to control the outputs of the first-stage bias circuit BC1 and the third-stage bias circuit BC3 according to the switch control signals $S_{2A}$~$S_{2C}$ and $S_{3A}$~$S_{3C}$.

Figure 2:
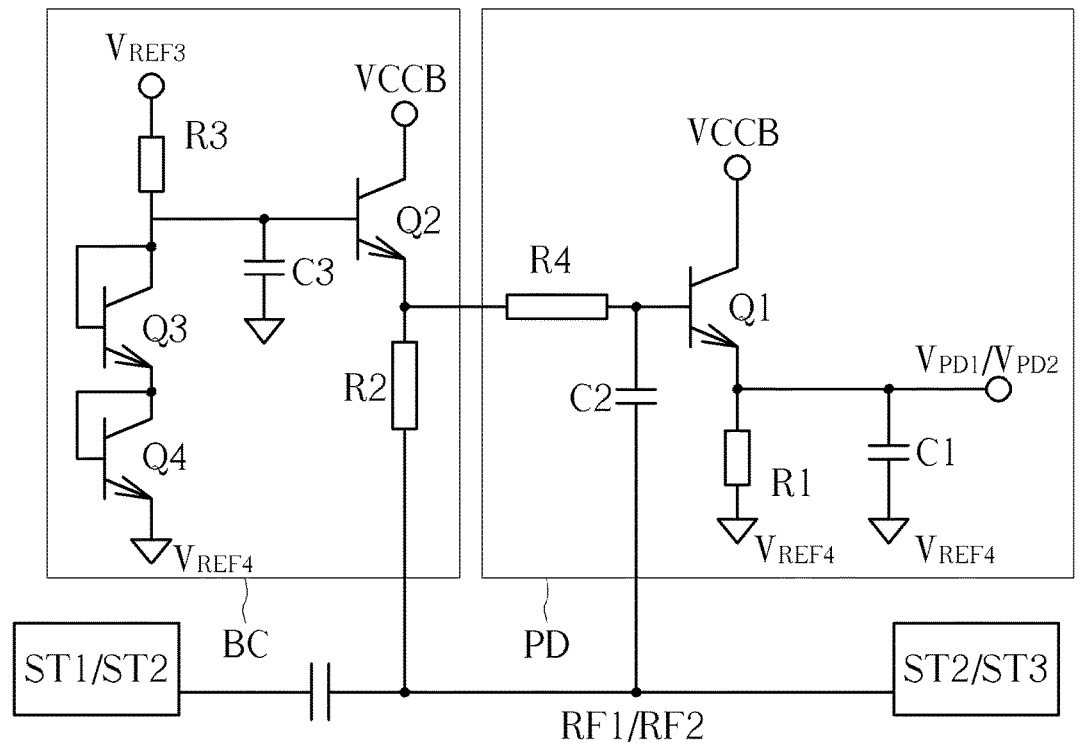
FIG. 2 is a diagram illustrating a signal strength detecting circuit and a bias circuit according to an embodiment of the present invention.

FIG. 2 is a diagram illustrating a signal strength detecting circuit PD and a bias circuit BC according to an embodiment of the present invention. The bias circuit BC includes transistors Q2~Q3, a capacitor C3, and resistors R2~R3, and can be used to implement a part of the second-stage bias circuit BC2 or the third-stage bias circuit BC3 in the power amplifier 100. According to another embodiment of the present invention, the bias circuit BC can be another bias circuit different from the second-stage bias circuit BC2 or the third-stage bias circuit BC3. The signal strength detecting circuit PD includes a transistor Q1, capacitors C1~C2, and resistors R1 and R4, and can be used to implement the first signal strength detecting circuit PD1 or the second signal strength detecting circuit PD2 in the power amplifier 100. When implemented as the first signal strength detecting circuit PD1, the input end of the signal strength detecting circuit PD is coupled between the RF output end of the first-stage amplifying circuit ST1 and the RF input end of the second-stage amplifying circuit ST2, or coupled to an intermediate stage of the power amplifier 100. In this embodiment, the signal strength detecting circuit PD is configured to detect the RF surge of the RF signal RF1 and generate a corresponding detecting signal $V_{PD1}$, wherein the value of the detecting signal $V_{PD1}$ is associated with the RF signal RF1, which is related to $RF_{IN}$, at the output end of the first-stage amplifying circuit ST1 and the VSWR signal from the second-stage amplifying circuit ST2. When implemented as the second signal strength detecting circuit PD2, the input end of the signal strength detecting circuit PD is coupled between the RF output end of the second-stage amplifying circuit ST2 and the RF input end of the third-stage amplifying circuit ST3, or coupled to an intermediate stage of the power amplifier 100. In this embodiment, the signal strength detecting circuit PD is configured to detect the RF surge of the RF signal RF2 and generate a corresponding detecting signal $V_{PD2}$, wherein the value of the detecting signal $V_{PD2}$ is associated with the RF signal RF2, which is related to $RF_{IN}$, at the output end of the second-stage amplifying circuit ST2 and the VSWR signal from the third-stage amplifying circuit ST3. The resistor R4 may be coupled between the transistor Q2, the resistor R2, and the transistor Q1. The resistor R2 of the bias circuit BC may provide operational bias voltages for the second-stage amplifying circuit ST2 and the third-stage amplifying circuit ST3. The resistors R3 and R4 may provide operational bias voltages for the transistors Q2 and Q1, respectively. According to another embodiment of the present invention, the signal strength detecting circuit PD may function as an OFDM signal peak detector.

Figure 3:
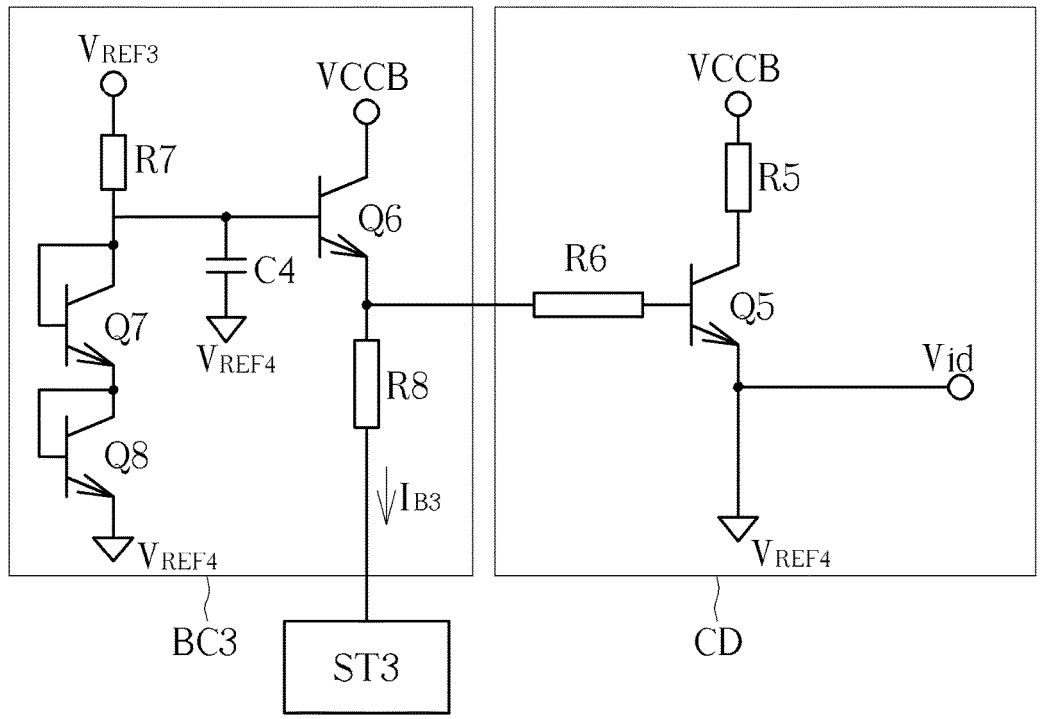
FIG. 3 is a diagram illustrating a current detecting circuit and a bias circuit according to an embodiment of the present invention.

FIG. 3 is a diagram illustrating the current detecting circuit CD and a bias circuit BC3 according to an embodiment of the present invention. The bias circuit BC3 includes transistors Q6~Q8, a capacitor C4, and resistors R7~R8, and is used to implement a part of the third-stage bias circuit BC3 in the power amplifier 100. The current detecting circuit CD includes a transistor Q5 and resistors R5~R6. The input end of the current detecting circuit CD is coupled to the third-stage bias circuit BC3. The current detecting circuit CD is configured to detect the bias current $I_{B3}$ of the third-stage amplifying circuit ST3 and generate a corresponding detecting signal Vid, wherein the value of the detecting signal Vid is associated with the RF signal $RF_{OUT}$ at the output end of the third-stage amplifying circuit ST3 and the VSWR signal from the third-stage amplifying circuit ST3. The resistor R5 may function as a current sensor. The resistor R6 may be coupled between the transistor Q6, the resistor R8, and the transistor Q5. The resistor R8 may provide operational bias voltages for the third-stage amplifying circuit ST3. The resistors R5 and R6 may provide operational bias voltages for the transistors Q5 and Q6, respectively.

Figure 4:
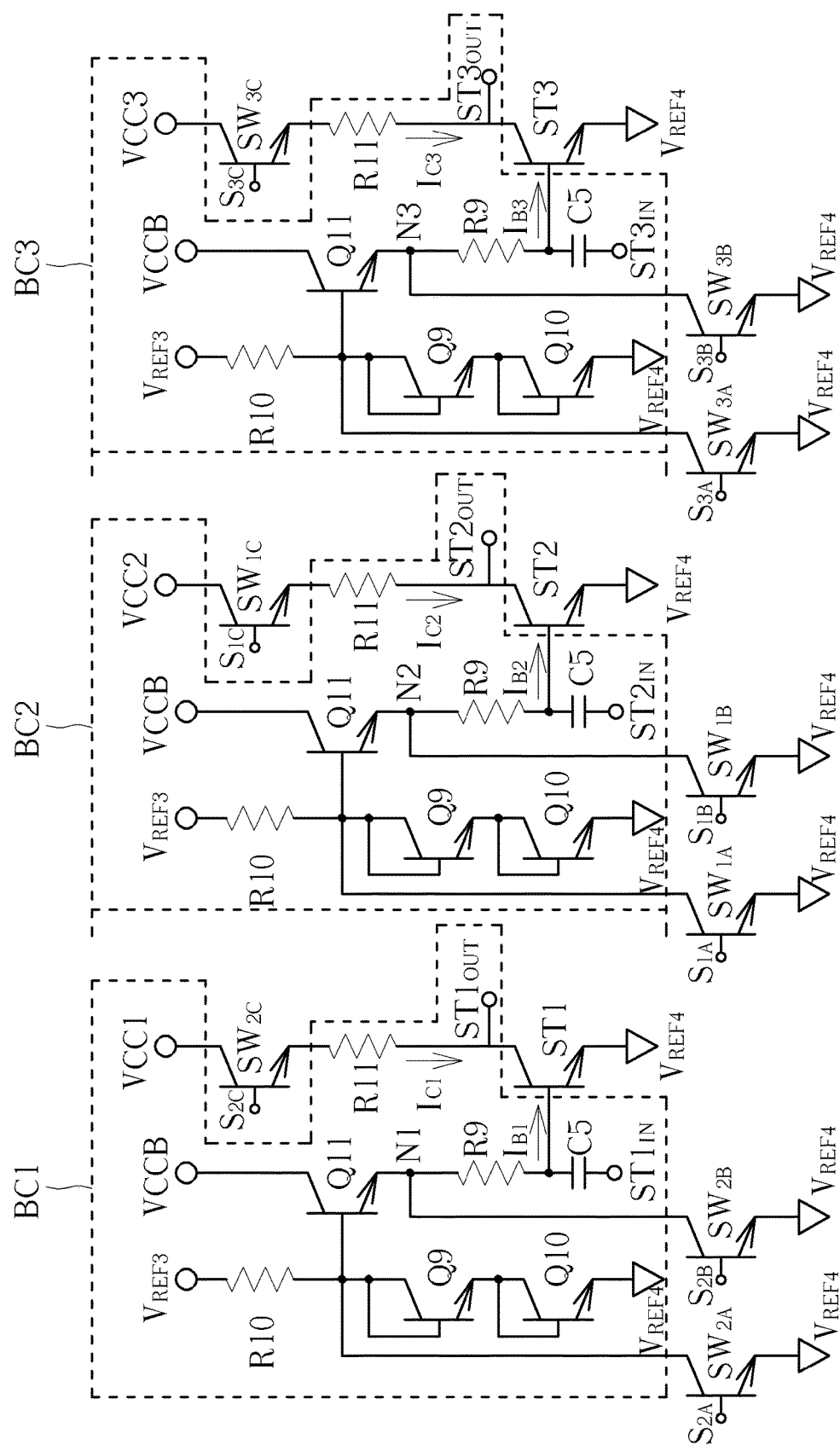
FIG. 4 is a diagram illustrating a protection circuit implemented in a bias circuit according to an embodiment of the present invention.

FIG. 4 is a diagram illustrating the protection circuit implemented in the bias circuit according to an embodiment of the present invention. For ease of explanation, FIG. 4 only depicts the first-stage to third-stage bias circuits BC1~BC3 and the switching units in the protection circuits. Each bias circuit includes transistors Q9~Q11, resistors R9~R11, and a capacitor C5. The first-stage to third-stage bias circuits BC1~BC3 each further include signal input ends $ST1_{IN}$~$ST3_{IN}$, signal output ends $ST1_{OUT}$~$ST3_{OUT}$, bias output ends N1~N3, and supply input ends VCC1~VCC3. The bias output ends N1~N3 are respectively coupled to the RF input ends of the first-stage to third-stage amplifying circuits ST1~ST3 for providing bias current $I_{B1}$~$I_{B3}$ to corresponding amplifying circuits ST1~ST3. The supply input ends VCC1~VCC3 are respectively coupled to the RF output ends of the first-stage to third-stage amplifying circuits ST1~ST3 for providing supply current $I_{C1}$~$I_{C3}$ to corresponding amplifying circuits ST1~ST3. In each bias circuit, the transistors Q9 and Q10 form a bias device, and the transistor Q11 functions as an output transistor. The resistor R9 is coupled between the output end of the transistor Q11 and the corresponding amplifying circuits ST1~ST3. The resistor R10 is coupled between the input end of the transistor Q11 and a third reference voltage $V_{REF3}$. The bias device formed by the transistors Q9 and Q10 is coupled between the input end of the transistor Q11 and a fourth reference voltage $V_{REF4}$. In an embodiment, the output end of the output transistor Q11 in the first-stage bias circuit BC1 is the bias output end N1, the output end of the output transistor Q11 in the second-stage bias circuit BC2 is the bias output end N2, the output end of the output transistor Q11 in the third-stage bias circuit BC3 is the bias output end N3. Therefore, the output transistors Q11 in the first-stage to third-stage bias circuits BC1~BC3 may output the bias current $I_{B1}$~$I_{B3}$ to the corresponding amplifying circuits ST1~ST3. In an embodiment, the supply input ends VCC1~VCC3 may be coupled to an external power source which supplies stable voltages. In an embodiment, the transistors Q9~Q11, the resistors R9~R11, and the capacitor C5 included in the first-stage to third-stage bias circuits BC1~BC3 may have different specifications. More specifically, the transistor Q9 in the first-stage bias circuit BC1, the transistor Q9 in the second-stage bias circuit BC2, and the transistor Q9 in the third-stage bias circuit BC3 may vary in size and type. Or, the resistor R9 in the first-stage bias circuit BC1, the resistor R9 in the second-stage bias circuit BC2, and the resistor R9 in the third-stage bias circuit BC3 may vary in resistance.

The first switching unit SW1 in the protection circuit 10 includes switches $SW_{1A}$~$SW_{1C}$. The switches $SW_{1A}$ and $SW_{1B}$ are configured to selectively couple the input end and output end of the output transistor Q11 in the second-stage bias circuit BC2 to the fourth reference voltage $V_{REF4}$ (such as a common voltage or ground) according to the switch control signals $S_{1A}$ and $S_{1B}$, respectively. The switch $SW_{1C}$ is configured to selectively conduct or cut off the path between the supply input end VCC2 and the second-stage amplifying circuit ST2 according to the switch control signal $S_{1C}$. The second switching unit SW2 in the protection circuit 20 includes switches $SW_{2A}$~$SW_{2C}$ and $SW_{3A}$~$SW_{3C}$. The switches $SW_{2A}$, $SW_{2B}$, $SW_{3A}$ and $SW_{3B}$ are configured to selectively couple the input end and output end of the output transistors Q11 in the first-stage bias circuit BC1 and the third-stage bias circuit BC3 to the fourth reference voltage $V_{REF4}$ according to the switch control signals $S_{2A}$, $S_{2B}$, $S_{3A}$ and $S_{3B}$, respectively. The switch $SW_{2C}$ is configured to selectively conduct or cut off the path between the supply input end VCC1 and the first-stage amplifying circuit ST1 according to the switch control signal $S_{2C}$. The switch $SW_{3C}$ is configured to selectively conduct or cut off the path between the supply input end VCC3 and the third-stage amplifying circuit ST3 according to the switch control signal $S_{3C}$.

In the present invention, the transistors Q1~Q11 may adopt bipolar junction transistors (BJTs), metal-oxide-semiconductor field-effect transistors (MOSFETs), or other switching devices having similar function. In an embodiment, the first-stage to third-stage amplifying circuits ST1~ST3 each includes a bipolar junction transistor. The collectors of the bipolar junction transistors are coupled to the RF output ends of the first-stage to third-stage amplifying circuits ST1~ST3, respectively. The bases of the bipolar junction transistors are coupled to the RF input ends of the first-stage to third-stage amplifying circuits ST1~ST3, respectively. The emitters of the bipolar junction transistors are coupled to the fourth reference voltage $V_{REF4}$. The bias current $I_{B1}$~$I_{B3}$ is supplied to the bases of the bipolar junction transistors in the first-stage to third-stage amplifying circuits ST1~ST3, respectively. The supply current $I_{C1}$~$I_{C3}$ is supplied to the collectors of the bipolar junction transistors in the first-stage to third-stage amplifying circuits ST1~ST3, respectively. For illustrative purpose, FIGS. 2-4 illustrate the embodiment using BJTs, wherein the input end and the output end of the transistors Q1~Q11 is the base and the emitter of BJT, respectively. However, the type of the transistors Q1~Q11 in the first-stage to third-stage amplifying circuits ST1~ST3 does not limit the scope of the present invention. Meanwhile, equivalent impedance matching circuits are omitted in FIGS. 2-4 for simplicity.

Figure 5:
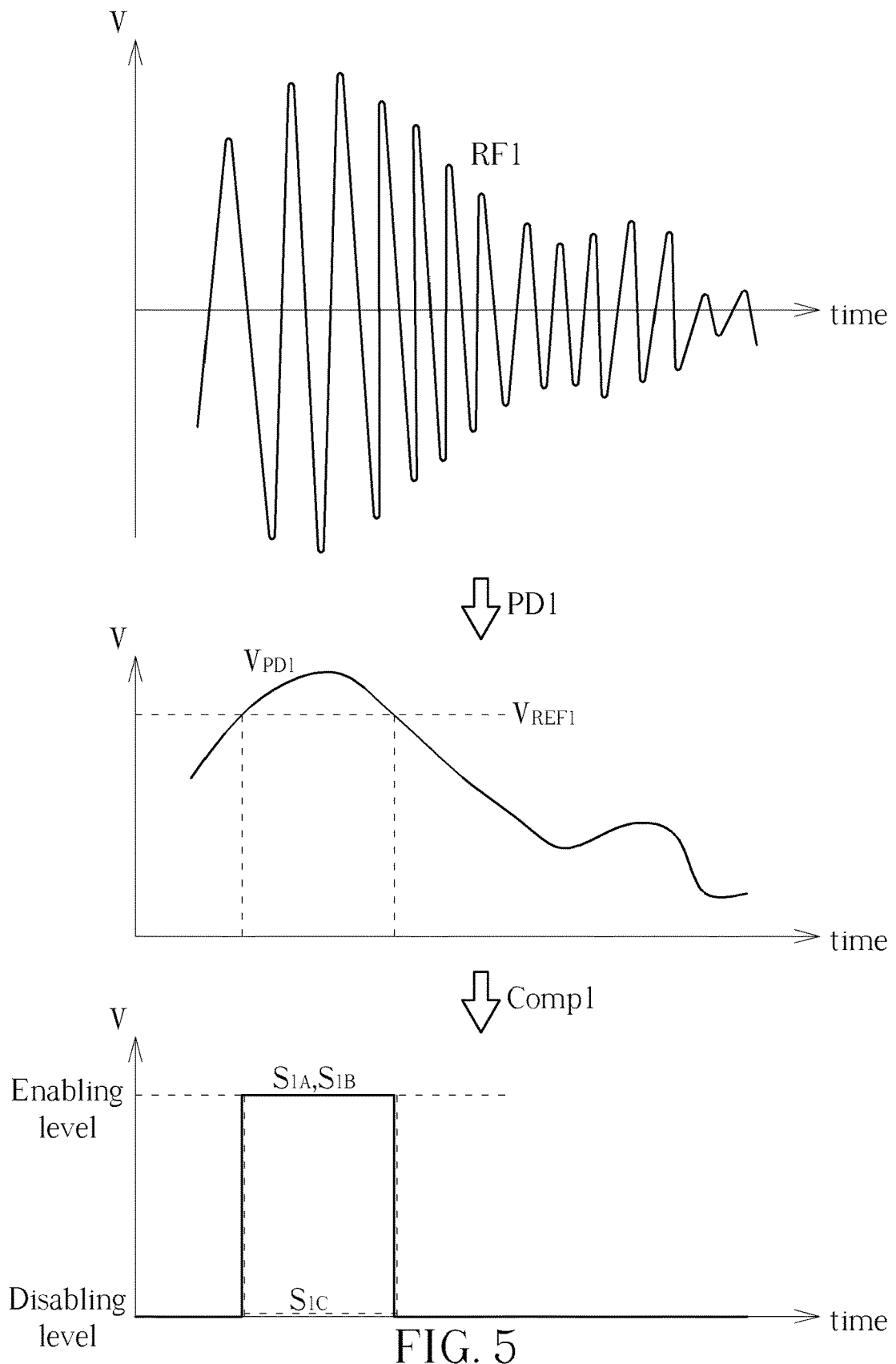
FIG. 5 is a diagram illustrating the operation of a protection circuit according to an embodiment of the present invention.

FIG. 5 is a diagram illustrating the operation of the protection circuit 10 according to the present invention. For illustrative purpose, it is assumed that the RF signal RF1 is an orthogonal frequency-division multiplexing (OFDM) signal in which a large number of closely spaced orthogonal sub-carrier signals are used to carry data. The detecting signal $V_{PD1}$ reflects the peak or the power of the RF signal RF1. When detecting that the peak or the power of the RF signal RF1 exceeds the first reference voltage $V_{REF1}$, the first logic circuit Comp1 of the protection circuit 10 is configured to output the switch control signals $S_{1A}$ and $S_{1B}$ at an enabling level (represented by a solid line at the bottom of FIG. 5) so as to turn on the switches $SW_{1A}$ and $SW_{1B}$ (short-circuited), and output the switch control signal $S_{1C}$ at an disabling level (represented by a dotted line at the bottom of FIG. 5) so as to turn off the switch $SW_{1C}$ (open-circuited). Under such circumstance, the input end and output end of the output transistor Q11 in the second-stage bias circuit BC2 may be coupled to the fourth reference voltage $V_{REF4}$, while the supply input end VCC2 may be electrically isolated from the second-stage amplifying circuit ST2, thereby turning off the transistor Q11 in the second-stage bias circuit BC2 for lowering the current flowing through the transistor Q11, and reducing the bias current $I_{B2}$ and the supply current $I_{C2}$ (e.g., cutting off the supply current $I_{C2}$ flowing to the second-stage amplifying circuit ST2). Therefore, when a surge somehow occurs in the input RF signal $RF_{IN}$, the present protection circuit 10 can rapidly shut down the second-stage bias circuit BC2, thereby shutting down the second-stage amplifying circuit ST2 in order to prevent the surge from damaging internal devices. In an embodiment, when detecting that the peak or the power of the RF signal RF1 exceeds the first reference voltage $V_{REF1}$, the first logic circuit Comp1 of the protection circuit 10 may also output one of the switch control signals $S_{1A}$ and $S_{1B}$ so as to turn on one of the switches $SW_{1A}$ and $SW_{1B}$ (short-circuited), output the switch control signal $S_{1c}$ so as to turn off the switch $SW_{1C}$ (open-circuited), or any combination from above in order to prevent the surge from damaging internal devices.

Figure 6:
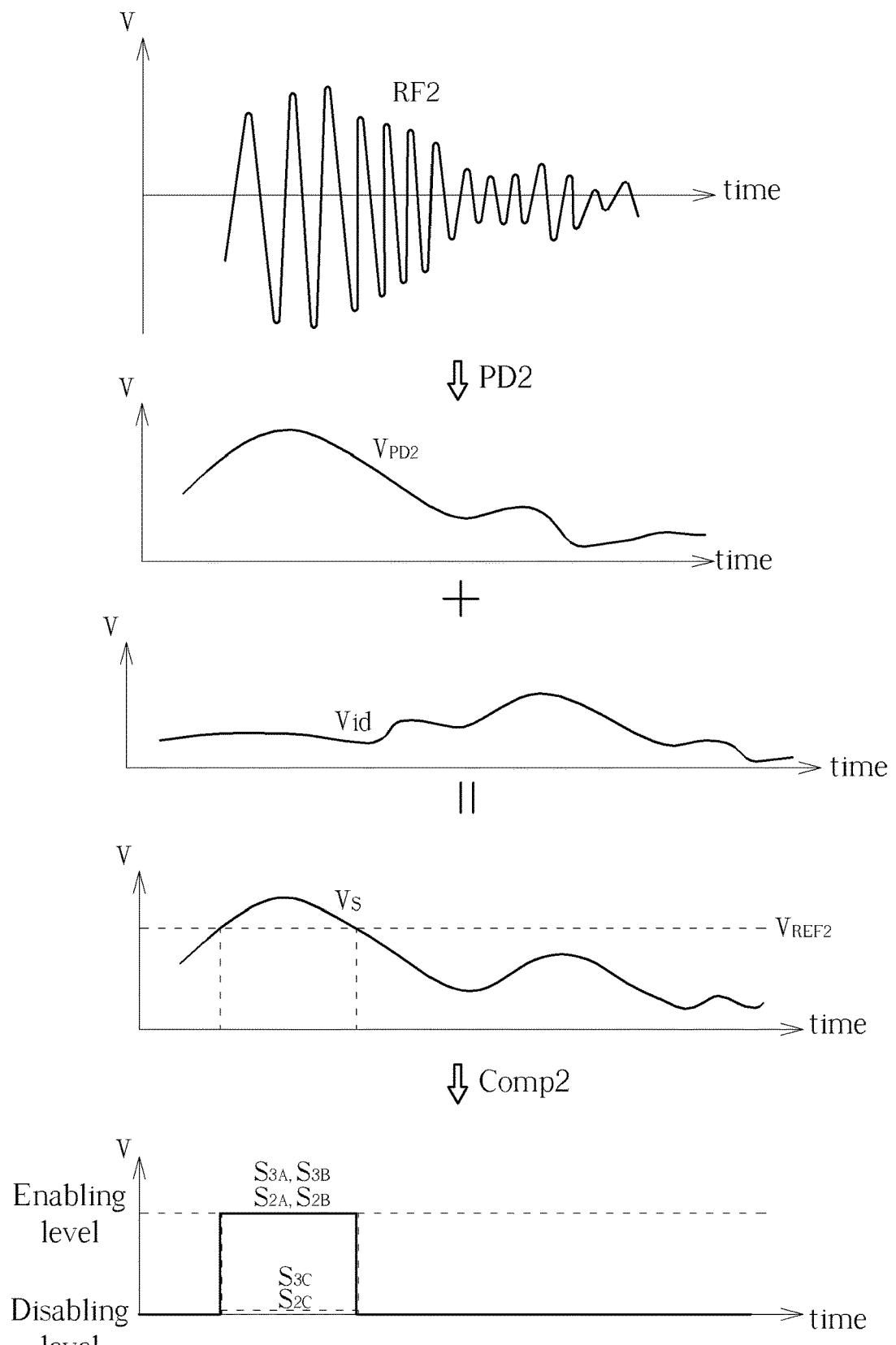
FIG. 6 is a diagram illustrating the operation of a protection circuit according to an embodiment of the present invention.

FIG. 6 is a diagram illustrating the operation of the protection circuit 20 according to the present invention. For illustrative purpose, it is assumed that the RF signal RF2 is an OFDM signal in which a large number of closely spaced orthogonal sub-carrier signals are used to carry data. The detecting signal $V_{PD2}$ reflects to the peak or the power of the RF signal RF2. The detecting signal Vid reflects to the bias current $I_{B3}$ of the third-stage amplifying circuit ST3. The detecting signal $V_s$ reflects the result of both the detecting signal $V_{PD2}$ and the detecting signal Vid. When the second logic circuit Comp2 of the protection circuit 20 detects that the detecting signal $V_s$ exceeds the second reference voltage $V_{REF2}$, it means that the peak or the power of the RF signal RF2 or the bias current $I_{B3}$ of the third-stage amplifying circuit ST3 exceeds its nominal value. Under such circumstance, the second logic circuit Comp2 of the protection circuit 20 is configured to output the switch control signals $S_{2A}$ and $S_{2B}$ at an enabling level (represented by a solid line at the bottom of FIG. 6) so as to turn on the switches $SW_{2A}$ and $SW_{2B}$ (short-circuited), output the switch control signals $S_{3A}$ and $S_{3B}$ at an enabling level (represented by a solid line at the bottom of FIG. 6) so as to turn on the switches $SW_{3A}$ and $SW_{3B}$ (short-circuited), output the switch control signal $S_{2C}$ at an disabling level (represented by a dotted line at the bottom of FIG. 6) so as to turn off the switch $SW_{2C}$ (open-circuited), and output the switch control signal $S_{3C}$ at an disabling level (represented by a dotted line at the bottom of FIG. 6) so as to turn off the switch $SW_{3C}$ (open-circuited). As a result, the input end and output end of the output transistors Q11 in the first-stage bias circuit BC1 and the third-stage bias circuit BC3 may be coupled to the fourth reference voltage $V_{REF4}$, while the supply input end VCC1 of the first-stage bias circuit BC1 may be electrically isolated from the first-stage amplifying circuit ST1 and the supply input end VCC3 of the third-stage bias circuit BC3 may be electrically isolated from the third-stage amplifying circuit ST3, thereby turning off the transistors Q11 in the first-stage bias circuit BC1 and the third-stage bias circuit BC3 for lowering the current flowing through the transistor Q11, the bias current $I_{B1}$, the supply current $I_{C1}$ (e.g., cutting off the supply current $I_{C1}$ flowing to the first-stage amplifying circuit ST1), the bias current $I_{B3}$, and the supply current $I_{C3}$ (e.g., cutting off the supply current $I_{C3}$ flowing to the third-stage amplifying circuit ST3). Therefore, when a surge somehow occurs in the input RF signal $RF_{IN}$, when there is an impedance mismatch between the second-stage bias circuit BC2 and the third-stage bias circuit BC3, or when there is an impedance mismatch between the third-stage bias circuit BC3 and the antenna, the present protection circuit 20 can rapidly shut down the first-stage bias circuit BC1 and the third-stage bias circuit BC3, thereby shutting down the first-stage amplifying circuit ST1 and the third-stage amplifying circuit ST3 in order to prevent the surge from damaging internal devices. In an embodiment, when detecting that the peak or the power of the RF signal RF2 or the bias current $I_{B3}$ of the third-stage amplifying circuit ST3 exceeds its nominal value, the second logic circuit Comp2 of the protection circuit 20 may also output one of the switch control signals $S_{2A}$ and $S_{2B}$ so as to turn on one of the switches $SW_{2A}$ and $SW_{2B}$ (short-circuited), output one of the switch control signals $S_{3A}$ and $S_{3B}$ so as to turn on one of the switches $SW_{3A}$ and $SW_{3B}$ (short-circuited), output the switch control signal $S_{2C}$ so as to turn off the switch $SW_{2C}$ (open-circuited), output the switch control signal $S_{3C}$ so as to turn off the switch $SW_{3C}$ (open-circuited), or any combination from above in order to prevent the surge or the voltage standing wave from damaging internal devices. In an embodiment, the above-mentioned protection circuits 10 and 20 may be used in an RF active circuit (e.g., an amplifying circuit) which is driven by the above-mentioned bias current.

In conclusion, when a voltage/current surge occurs in the system or the impedance of two connecting devices becomes mismatched, the power amplifier of the present invention can rapidly shut down corresponding devices, thereby reducing the negative impact caused by the surge or the VSWR.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A power amplifier, comprising:
an input end for inputting a radio frequency (RF) signal;
an output end for outputting the RF signal after being amplified;
a first amplifying circuit configured to amplify the RF signal and comprising:
  an RF input end coupled to the input end of the power amplifier for inputting the RF signal;
  an RF output end coupled to the output end of the power amplifier for outputting the RF signal after being amplified;
a second amplifying circuit configured to amplify the RF signal and coupled between the input end of the power amplifier and the RF input end of the first amplifying circuit;
a first supply input end for inputting first supply current;
a second supply input end for inputting second supply current;
a first bias circuit for outputting first bias current at a bias output end;
a second bias circuit for outputting second bias current at a bias output end, wherein the first amplifying circuit is driven by the first bias current and the first supply current and the second amplifying circuit is driven by the second bias current and the second supply current; and
a first protection circuit coupled to the RF input end of the first amplifying circuit and comprising:
  a first signal strength detecting circuit configured to detect an RF surge of the RF signal, thereby generating a corresponding first detecting signal;
  a first current detecting circuit coupled to the first amplifying circuit and configured to generate a second detecting signal according to the first bias current;
  a first logic circuit configured to generate a first switch control signal and a second switch control signal according to the first detecting signal and the second detecting signal;
  a first switch configured to lower the first bias current or the first supply current according to the first switch control signal; and
  a second switch configured to lower the second bias current or the second supply current according to the second switch control signal.

2. The power amplifier of claim 1, further comprising:
a third amplifying circuit configured to amplify the RF signal and coupled between the first amplifying circuit and the second amplifying circuit, the third amplifying circuit comprising:
  an RF input end coupled to the second amplifying circuit for inputting the RF signal;
  an RF output end coupled to the first amplifying circuit for outputting the RF signal after being amplified;
  a third supply input end for inputting third supply current;
  a third bias circuit for outputting third bias current at a bias output end, wherein the third amplifying circuit is driven by the third bias current and the third supply current; and
a second protection circuit coupled to the RF input end of the third amplifying circuit and comprising:
  a second signal strength detecting circuit configured to detect the RF surge of the RF signal, thereby generating a corresponding third detecting signal;
  a second logic circuit configured to generate a third switch control signal according to the third detecting signal; and
  a third switch configured to lower the third bias current or the third supply current according to the third switch control signal.

3. A power amplifier, comprising:
an input end for inputting an RF signal;
an output end for outputting the RF signal after being amplified;
a first amplifying circuit configured to amplify the RF signal and comprising:
  an RF input end coupled to the input end of the power amplifier for inputting the RF signal;
  an RF output end coupled to the output end of the power amplifier for outputting the RF signal after being amplified;
a first supply input end for inputting first supply current;
a first bias circuit for outputting first bias current at a bias output end, wherein the power amplifier is driven by the first bias current and the first supply current; and
a first protection circuit coupled to the RF input end of the first amplifying circuit or the RF output end of the first amplifying circuit, and comprising:
  a first signal strength detecting circuit configured to detect an RF surge of the RF signal, thereby generating a corresponding first detecting signal;
  a first logic circuit configured to generate a first switch control signal according to the first detecting signal; and
  a first switching unit configured to lower the first bias current or the first supply current according to the first switch control signal.

4. The power amplifier of claim 3, wherein the first signal strength detecting circuit is configured to detect the RF surge of the RF signal by detecting a peak or a power of the RF signal.

5. The power amplifier of claim 3, wherein the first amplifying circuit is driven by the first bias current and the first supply current.

6. The power amplifier of claim 5, wherein the first supply input end is coupled to the RF output end of the first amplifying circuit, and the bias output end of the first bias circuit is coupled to the RF input end of the first amplifying circuit.

7. The power amplifier of claim 6, wherein the first switching unit is configured to selectively coupled the bias output end of the first bias circuit to a first reference voltage according to the first switch control signal.

8. The power amplifier of claim 7, wherein:
the first bias circuit includes an output transistor for outputting the first bias current; and
the first switching unit includes a first switch configured to selectively couple an output end of the output transistor to the first reference voltage, thereby shutting down the first amplifying circuit by lowering the first bias current flowing to the first amplifying circuit.

9. The power amplifier of claim 8, wherein:
the first switching unit further includes a second switch configured to selectively couple an input end of the output transistor to the first reference voltage, thereby shutting down the output transistor for reducing current flowing through the output transistor.

10. The power amplifier of claim 9, wherein the first bias circuit further includes:
a first resistor coupled between the output end of the output transistor and the first amplifying circuit;
a second resistor coupled between the input end of the output transistor and a second reference voltage; and
a bias element coupled between the input end of the output transistor and the first reference voltage.

11. The power amplifier of claim 6, wherein the first switching unit is configured to selectively couple the first supply input end to the first amplifying circuit or isolate the first supply input end from the first amplifying circuit according to the first switch control signal.

12. The power amplifier of claim 11, wherein:
the first switching unit further includes a third switch coupled between the first supply input end and the first amplifying circuit and configured to selectively shut down the first amplifying circuit by cutting off the first supply current flowing to the first amplifying circuit.

13. The power amplifier of claim 3, further comprising a second amplifying circuit configured to amplify the RF signal and coupled to the first amplifying circuit, wherein the second amplifying circuit is driven by the first bias current and the first supply current.

14. The power amplifier of claim 13, wherein the second amplifying circuit comprises:
an RF input end coupled to the input end of the power amplifier for inputting the RF signal;
an RF output end coupled to the output end of the power amplifier for outputting the RF signal after being amplified;
the first supply input end is coupled to the RF output end of the second amplifying circuit; and
the bias output end of the first bias circuit is coupled to the RF input end of the second amplifying circuit.

15. The power amplifier of claim 14, wherein the first switching unit is configured to selectively couple the bias output end of the first bias circuit to a first reference voltage.

16. The power amplifier of claim 14, wherein the first switching unit is configured to selectively couple the first supply input end to the second amplifying circuit or isolate the first supply input end from the second amplifying circuit according to the first switch control signal.

17. The power amplifier of claim 5, wherein:
the first protection circuit is coupled to the RF input end of the first amplifying circuit;
the first protection circuit further includes a first current detecting circuit coupled to the first amplifying circuit and configured to generate a second detecting signal according to the first bias current; and
the first logic circuit is configured to generate the first switch control signal further according to the second detecting signal.

18. The power amplifier of claim 5, wherein the first protection circuit is coupled to the RF input end of the first amplifying circuit, and the power amplifier further comprises:
a second amplifying circuit configured to amplify the RF signal and coupled between the input end of the power amplifier and the first amplifying circuit, the second amplifying circuit comprising:
an RF input end coupled to the input end of the power amplifier for inputting the RF signal;
an RF output end coupled to the output end of the power amplifier for outputting the RF signal after being amplified;
a second supply input end for inputting second supply current;
a second bias circuit for outputting second bias current at a bias output end, wherein the second amplifying circuit is driven by the second bias current and the second supply current; and
a second protection circuit coupled to the RF input end of the second amplifying circuit and comprising:
a second signal strength detecting circuit configured to detect the RF surge of the RF signal, thereby generating a corresponding second detecting signal;
a second logic circuit configured to generate a second switch control signal according to the second detecting signal; and
a second switching unit configured to lower the second bias current or the second supply current according to the second switch control signal.

19. The power amplifier of claim 5, wherein:
the first protection circuit is coupled to the RF input end of the first amplifying circuit;
the power amplifier further comprises:
a third amplifying circuit configured to amplify the RF signal and coupled between the input end of the power amplifier and the first amplifying circuit, the third amplifying circuit comprising:
an RF input end coupled to the input end of the power amplifier for inputting the RF signal;
an RF output end coupled to the RF output end of the first amplifying circuit for outputting the RF signal after being amplified;
a third supply input end for inputting third supply current;
a third bias circuit for outputting third bias current at a bias output end, wherein the third amplifying circuit is driven by the third bias current and the third supply current; and
the first protection circuit further comprises a third switching unit configured to lower the third bias current or the third supply current according to the first switch control signal.

20. A protection circuit for use in an active RF circuit which is driven by driving current, comprising:
a first signal strength detecting circuit coupled to an RF input end or an RF output end of the active RF circuit and configured to generate a first detecting signal according to a signal strength of the RF signal;
a first current detecting circuit coupled to the active RF circuit and configured to detect a voltage standing wave ratio of the RF signal based on the driving current, thereby generating a corresponding second detecting signal;
a first logic circuit configured to generate a first switch control signal according to the first detecting signal and the second detecting signal; and
a first switching unit configured to lower the driving current according to the first switch control signal.

* * * * *